(12) United States Patent
Oh et al.

(10) Patent No.: US 12,394,650 B2
(45) Date of Patent: Aug. 19, 2025

(54) SEMICONDUCTOR FABRICATION FACILITY

(71) Applicant: Samsung Electronics Co., Ltd., Suwon-si (KR)

(72) Inventors: Youngon Oh, Hwaseong-si (KR); Youngcheol Jang, Hwaseong-si (KR); Jihun Kim, Uiwang-si (KR); Sanghyuk Park, Yongin-si (KR); Sangho Yoon, Yongin-si (KR); Seungyeob Lee, Yongin-si (KR); Chul Min Lee, Changwon-si (KR); Hochan Lee, Seoul (KR); Jaegyun Jeon, Suwon-si (KR); Jeongkwan Jung, Anyang-si (KR); Hyeong Seok Choo, Suwon-si (KR); Dongyeol Han, Pyeongtaek-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 394 days.

(21) Appl. No.: 17/894,371

(22) Filed: Aug. 24, 2022

(65) Prior Publication Data

US 2023/0230864 A1    Jul. 20, 2023

(51) Int. Cl.
*H01L 21/677*    (2006.01)

(52) U.S. Cl.
CPC .. *H01L 21/67733* (2013.01); *H01L 21/67706* (2013.01); *H01L 21/67724* (2013.01)

(58) Field of Classification Search
CPC ......... H01L 21/67733; H01L 21/67706; H01L 21/67724; H01L 21/6773; H01L 21/67736; B61B 3/00; B61B 3/02; B61B 10/02; B61B 10/025; B61B 15/00
See application file for complete search history.

(56) References Cited

U.S. PATENT DOCUMENTS

| | | | | |
|---|---|---|---|---|
| 4,341,161 A | * | 7/1982 | Morita | B61B 10/022 104/172.4 |
| 4,408,539 A | * | 10/1983 | Wakabayashi | E01B 25/22 105/156 |
| 4,724,944 A | * | 2/1988 | Koshigai | B62D 65/18 105/156 |
| 5,996,771 A | * | 12/1999 | Estes | B62D 65/18 198/465.4 |
| 6,089,161 A | | 7/2000 | Saban | |
| 10,899,546 B2 | | 1/2021 | Munday et al. | |

(Continued)

FOREIGN PATENT DOCUMENTS

| KR | 1019940005347 A | 3/1994 |
|---|---|---|
| KR | 1019970010895 B1 | 7/1997 |
| KR | 100768249 B1 | 10/2007 |

(Continued)

*Primary Examiner* — Glenn F Myers
(74) *Attorney, Agent, or Firm* — Harness, Dickey & Pierce, P.L.C.

(57) ABSTRACT

A semiconductor fabrication facility including raceways on a ceiling of a structural construction and extending in one direction, a vehicle rail assembly coupled to the raceways, outer jig rails on outer sidewalls of the raceways and adjacent to the vehicle rail assembly, and an outer jig on the outer jig rails and configured to allow the vehicle rail assembly to move along the outer jig rails may be provided.

19 Claims, 11 Drawing Sheets

(56) References Cited

U.S. PATENT DOCUMENTS

2022/0073284 A1\* 3/2022 Nobuta ............. H01L 21/67727

FOREIGN PATENT DOCUMENTS

| KR | 101087066 B1 | 11/2011 |
|----|--------------|---------|
| KR | 101676718 B1 | 11/2016 |
| KR | 101973103 B1 | 4/2019  |
| KR | 101974063 B1 | 4/2019  |

\* cited by examiner

SEMICONDUCTOR FABRICATION FACILITY

CROSS-REFERENCE TO RELATED APPLICATION

This U.S. nonprovisional application claims priority under 35 U.S.C § 119 to Korean Patent Application No. 10-2022-0008813 filed on Jan. 20, 2022 in the Korean Intellectual Property Office, the disclosure of which is hereby incorporated by reference in its entirety.

BACKGROUND

The present inventive concepts relate to a substrate fabrication system, and more particularly, to a semiconductor fabrication facility.

In general, semiconductor devices are fabricated by applying a plurality of unit processes. The unit processes may include a film deposition process, a diffusion process, an annealing process, a photolithography process, a grinding process, an etching process, an ion implantation process, and a cleaning process. Substrate fabrication apparatuses may independently perform the unit processes. The substrate fabrication apparatuses may be installed in a clean room. A substrate may be delivered by an overhead hoist transport (OHT) in the clean room.

SUMMARY

The present inventive concepts provide a semiconductor fabrication facility capable of establishing a vehicle rail assembly on raceways.

According to an example embodiment of the present inventive concepts, a semiconductor fabrication facility includes raceways on a ceiling of a structural construction, the raceways extending in one direction, a vehicle rail assembly coupled to the raceways, outer jig rails on outer sidewalls of the raceways and adjacent to the vehicle rail assembly, and an outer jig on the outer jig rails, the outer jig configured to allow the vehicle rail assembly to move along the outer jig rails.

According to an example embodiment of the present inventive concepts, a semiconductor fabrication facility includes raceways on a ceiling of a structural construction, the raceways extending in one direction, a vehicle rail assembly coupled to the raceways, outer jig rails on outer sidewalls of the raceways and adjacent to the vehicle rail assembly, an outer jig on the outer jig rails, the outer jig configured to allow the vehicle rail assembly to move along the outer jig rails, inner jig rails on inner sidewalls of the raceways, and an inner jig on the inner jig rails, the inner jig configured to allow the vehicle rail assembly to move along the inner jig rails.

According to an example embodiment of the present inventive concepts, a semiconductor fabrication facility includes raceways on a ceiling of a structural construction, the raceways extending in one direction, a vehicle rail assembly coupled to the raceways, outer jig rails on outer sidewalls of the raceways and adjacent to the vehicle rail assembly, an outer jig on the outer jig rails, the outer jig configured to allow the vehicle rail assembly to move along the outer jig rails, inner jig rails on inner sidewalls of the raceways, an inner jig on the inner jig rails, the inner jig configured to allow the vehicle rail assembly to move along the inner jig rails, a table lifting unit configured to support the vehicle rail assembly, and a lever on the table lifting unit, the lever configured to lift the inner jig and the vehicle rail assembly.

DETAIL DESCRIPTION

Figure 1:
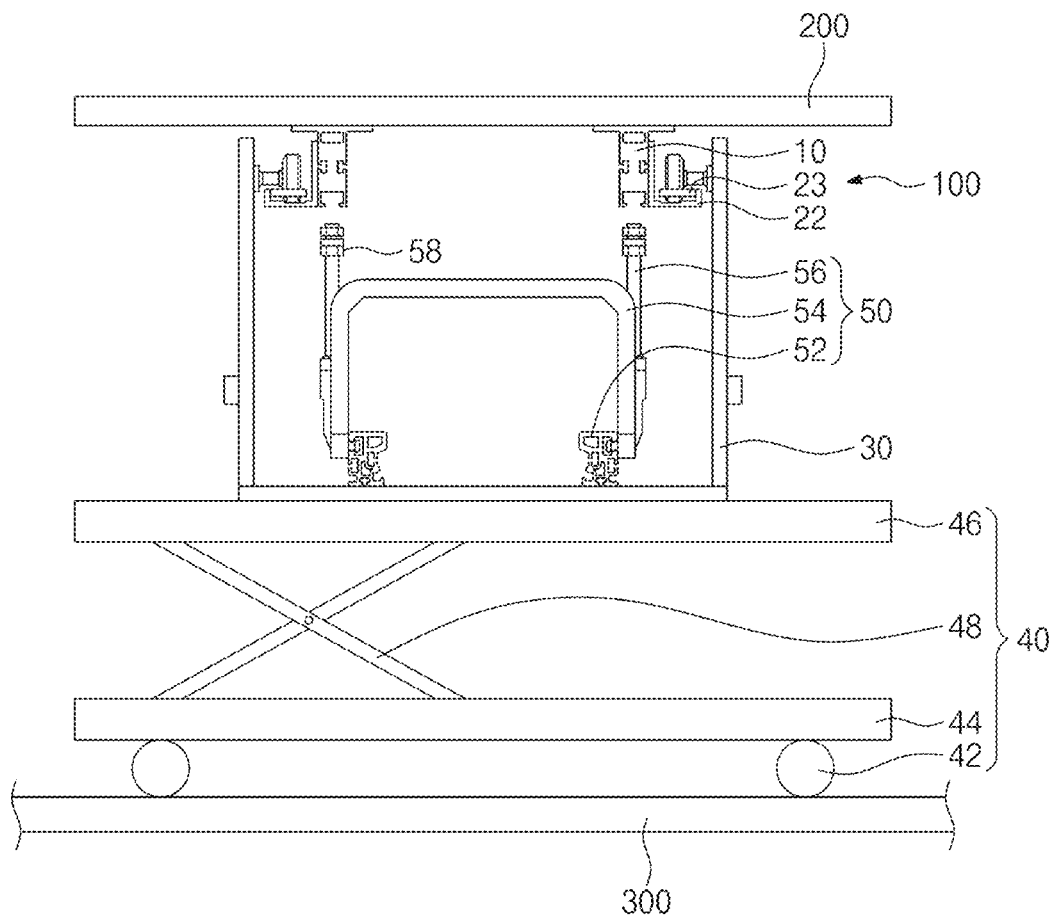
FIG. 1 illustrates a cross-sectional view showing an example of a semiconductor fabrication facility according to an example embodiment of the present inventive concepts.

FIG. 1 shows an example of a semiconductor fabrication facility 100 according to an example embodiment of the present inventive concepts.

Referring to FIG. 1, a semiconductor fabrication facility 100 according to an example embodiment of the present inventive concepts may be provided in a structural construction (e.g., clean room). The semiconductor fabrication facility 100 may be provided between a ceiling 200 and a floor 300 of the structural construction. The ceiling 200 may include a mold bar (not shown). In some example embodiments, the ceiling 200 may include the framework of a building. For example, the semiconductor fabrication facility 100 may include raceways 10, outer jig rails 22, an outer jig 30, a table lifting unit 40, and a vehicle rail assembly 50.

The raceways 10 may be disposed on the ceiling 200. The raceways 10 may extend in one direction. The raceways 10 may be parallel to each other. The raceways 10 may be fixed through bolts to the ceiling 200. The raceways 10 may include, for example, iron or tungsten. The raceways 10 may have therebetween an interval of about 50 cm to about 130 cm, but the present inventive concepts are not limited thereto.

The outer jig rails 22 may be located on opposite outer sidewalls of the raceways 10 and adjacent to the vehicle rail assembly 50. The outer jig rails 22 may extend in a direction the same as that in which the raceways 10 extend. The outer jig rails 22 may support the outer jig 30. For example, each of the outer jig rails 22 may include metal, such as iron or tungsten, but the present inventive concepts are not limited thereto.

Figure 2:
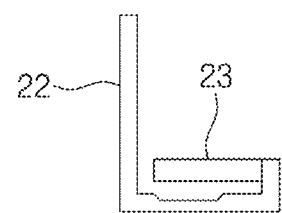
FIG. 2 illustrates a cross-sectional view showing an example of an outer jig rail depicted in FIG. 1.

FIG. 2 shows an example of the outer jig rail 22 shown in FIG. 1.

Referring to FIGS. 1 and 2, the outer jig rail 22 may have an L-type cross-section. One side of the outer jig rail 22 may be fixed through bolts to a corresponding outer sidewall of a corresponding raceway 10. The outer jig 30 may move along another side of the outer jig rail 22. According to an example embodiment, the outer jig rail 22 may have a stopper 23. The stopper 23 may be provided on the another side of the outer jig rail 22. The stopper 23 may fix a first roller (see 38 of FIG. 3) of the outer jig 30.

Figure 3:
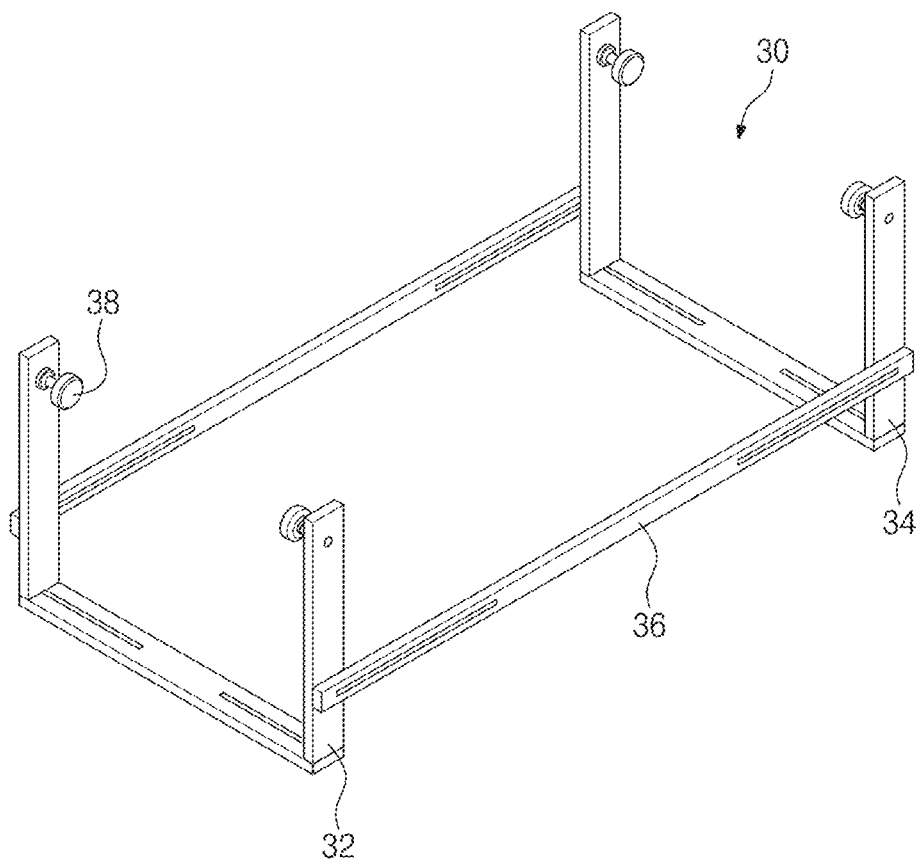
FIG. 3 illustrates a perspective view showing an example of an outer jig depicted in FIG. 1.

FIG. 3 shows an example of the outer jig 30 shown in FIG. 1.

Referring to FIGS. 1 and 3, the outer jig 30 may support the vehicle rail assembly 50. The outer jig 30 may deliver the vehicle rail assembly 50 along the outer jig rail 22. For example, the outer jig 30 may include metal, such as iron or tungsten. In some example embodiments, the outer jig 30 may include a polymer compound such as plastic, but the present inventive concepts are not limited thereto. According to an example embodiment, the outer jig 30 may include a first outer jig (alternatively, referred to as a first outer support) 32, a second outer jig (alternatively, referred to as a second outer support) 34, connection bars 36, and first rollers 38.

The first outer jig 32 may be spaced apart from the second outer jig 34. The first outer jig 32 may have a U shape. The first outer jig 32 may support one side of the vehicle rail assembly 50.

The second outer jig 34 may have the same shape as that of the first outer jig 32. The second outer jig 34 may have a U shape. The first outer jig 32 and the second outer jig 34 may support an opposite side of the vehicle rail assembly 50.

The connection bars 36 may connect the first outer jig 32 to the second outer jig 34. The connection bars 36 may be disposed on lateral surfaces of the first and second outer jigs 32 and 34. The first outer jig 32 and the second outer jig 34 may be fixedly spaced apart at a constant interval from each other across the connection bars 36.

The first rollers 38 may be disposed at corresponding ends of the first and second outer jigs 32 and 34. The first rollers 38 may be provided on the outer jig rails 22. The first rollers 38 may rotate along the outer jig rails 22. The first outer jig 32, the second outer jig 34, and the connection bars 36 may move due to the rotation of the first rollers 38.

Therefore, the outer jig rails 22 and the outer jig 30 may drive the vehicle rail assembly 50 to easily move along the raceways 10.

Referring back to FIG. 1, the table lifting unit 40 may be provided below the outer jig 30 and the vehicle rail assembly 50. When the vehicle rail assembly 50 is provided on the table lifting unit 40, the table lifting unit 40 may lift the vehicle rail assembly 50 on the first and second outer jigs 32 and 34 of the outer jig 30.

Figure 4:
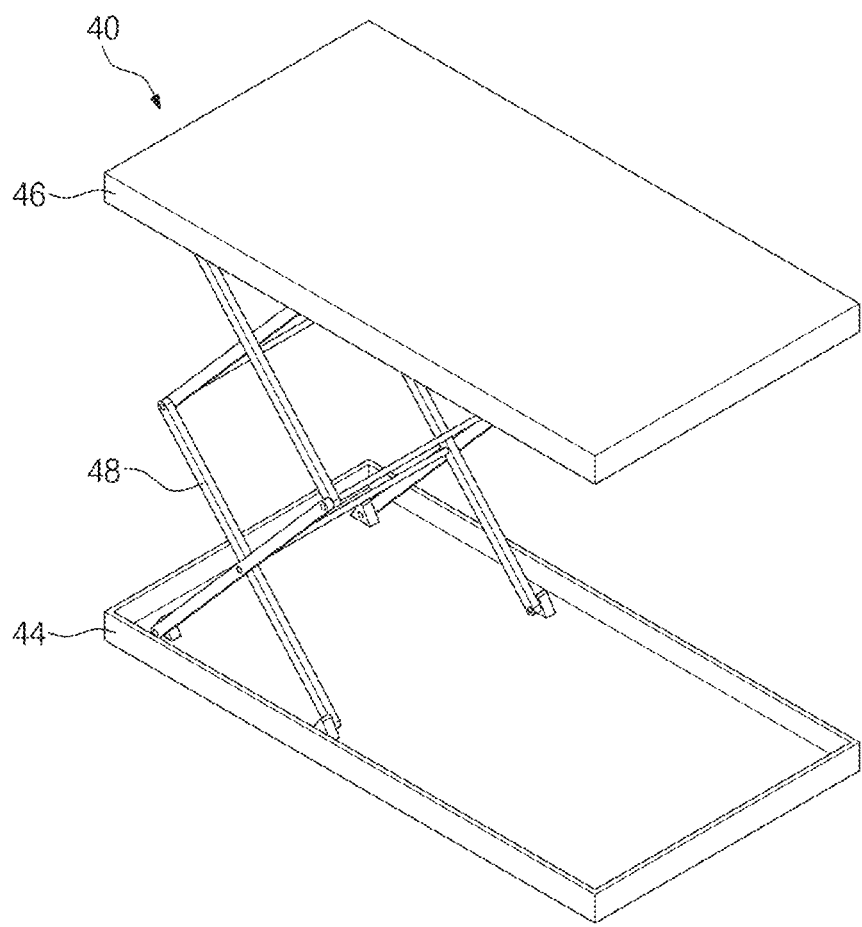
FIG. 4 illustrates a perspective view showing an example of a table lifting unit depicted in FIG. 1.

FIG. 4 shows an example of the table lifting unit 40 depicted in FIG. 1.

Referring to FIGS. 1 and 4, the table lifting unit 40 may include wheels 42, a lower plate 44, an upper plate 46, and ladder bars 48.

The wheels 42 may support the lower plate 44. The wheels 42 may allow the lower plate 44, the upper plate 46, and the ladder bars 48 to move along the floor 300.

The lower plate 44 may be provided on the wheels 42. The wheels 42 may be fixed to a bottom surface of the lower plate 44. The lower plate 44 may be parallel to the floor 300.

The upper plate 46 may be disposed above the lower plate 44. The upper plate 46 may be parallel to the lower plate 44. The ladder bars 48 may cause the upper plate 46 to move away from or close to the lower plate 44.

The ladder bars 48 may be provided between the lower plate 44 and the upper plate 46. The ladder bars 48 may adjust a distance between the lower plate 44 and the upper plate 46. The ladder bars 48 may constitute an X shape. A cylinder (not shown) may drive the ladder bars 48 to lift or lower the upper plate 46.

Figure 5:
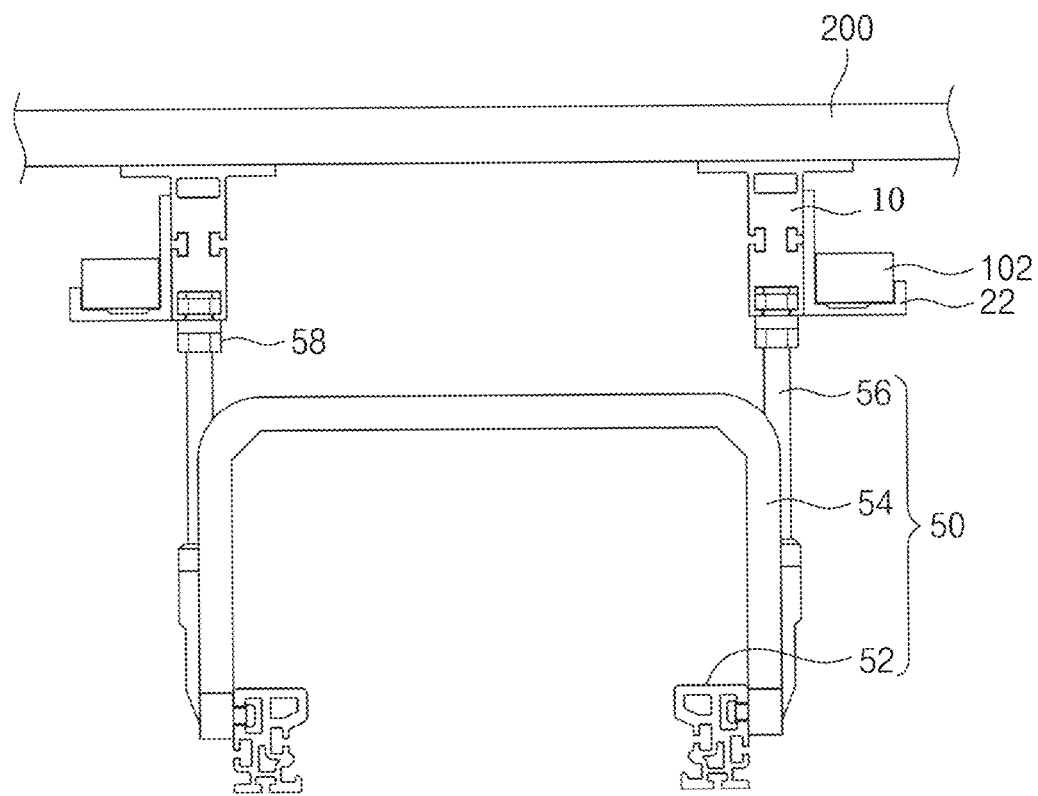
FIG. 5 illustrates a cross-sectional view showing an example of raceways and a vehicle rail assembly depicted in FIG. 1.
Figure 6:
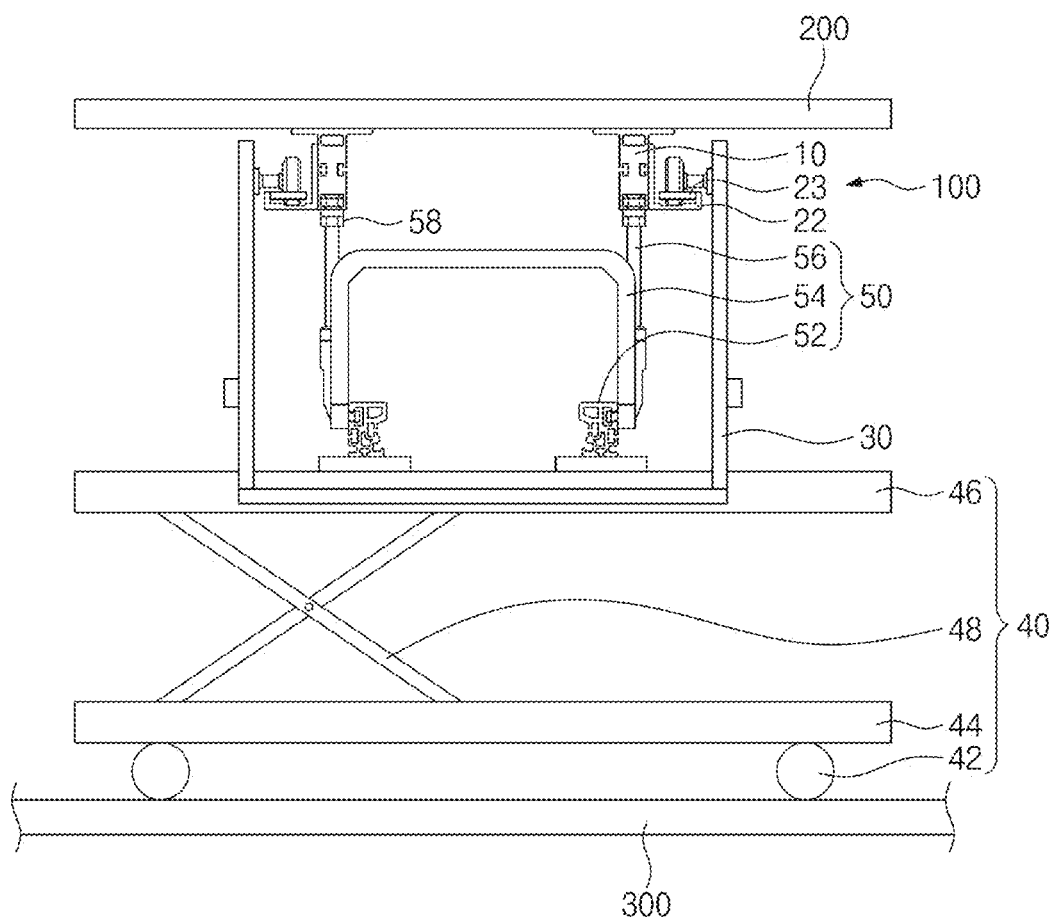
FIG. 6 illustrates a cross-sectional view showing an example of an upper plate that supports a vehicle rail assembly depicted in FIG. 1.

FIG. 5 shows an example of the raceways 10 and the vehicle rail assembly 50 depicted in FIG. 1. FIG. 6 shown an example of the upper plate 46 that supports the vehicle rail assembly 50 depicted in FIG. 1.

Referring to FIGS. 1 and 3 to 6, the upper plate 46 may be provided between the first outer jig 32 and the second outer jig 34. The upper plate 46 may support the vehicle rail assembly 50. The upper plate 46 may lift the vehicle rail assembly 50.

Referring to FIGS. 5 and 6, the vehicle rail assembly 50 may be coupled to the raceways 10. When the table lifting unit 40 is removed, the vehicle rail assembly 50 may guide an overhead hoist transport (OHT) (not shown). According to an example embodiment, the vehicle rail assembly 50 may include vehicle rails 52, a rail connector 54, and rail hangers 56.

The vehicle rails 52 may be provided below the rail connector 54 and the rail hangers 56. The vehicle rails 52 may be parallel to the raceways 10. The vehicle rails 52 may be guide rails or traveling rails for the OHT, but the present inventive concepts are not limited thereto.

The rail connector 54 may be provided between the vehicle rails 52. The vehicle rails 52 may be fixedly spaced apart at a constant interval from each other across the rail connector 54. The rail connector 54 may have a π shape.

The rail hangers 56 may be connected to the vehicle rails 52 and the rail connector 54. The vehicle rails 52 and the rail connector 54 may be connected through the rail hangers 56 to the raceways 10. The rail hangers 56 may have a plurality of nuts 58. The nuts 58 may connect the rail hangers 56 to lower portions of the raceways 10.

The semiconductor fabrication facility 100 according to the above example embodiment of the present inventive concepts may be configured such that the outer jig rails 22, the outer jig 30, and the table lifting unit 40 are used to easily couple the vehicle rail assembly 50 to the raceways 10.

When the outer jig 30 is separated from the outer jig rails 22, a wiring duct 102 may be provided on the outer jig rails 22. The wiring duct 102 may surround an electric line (see 104 of FIG. 12).

The following will describe in detail a method of establishing the vehicle rail assembly 50 by using the semiconductor fabrication facility 100 configured as discussed above according to the above example embodiment of the present inventive concepts.

Figure 7:
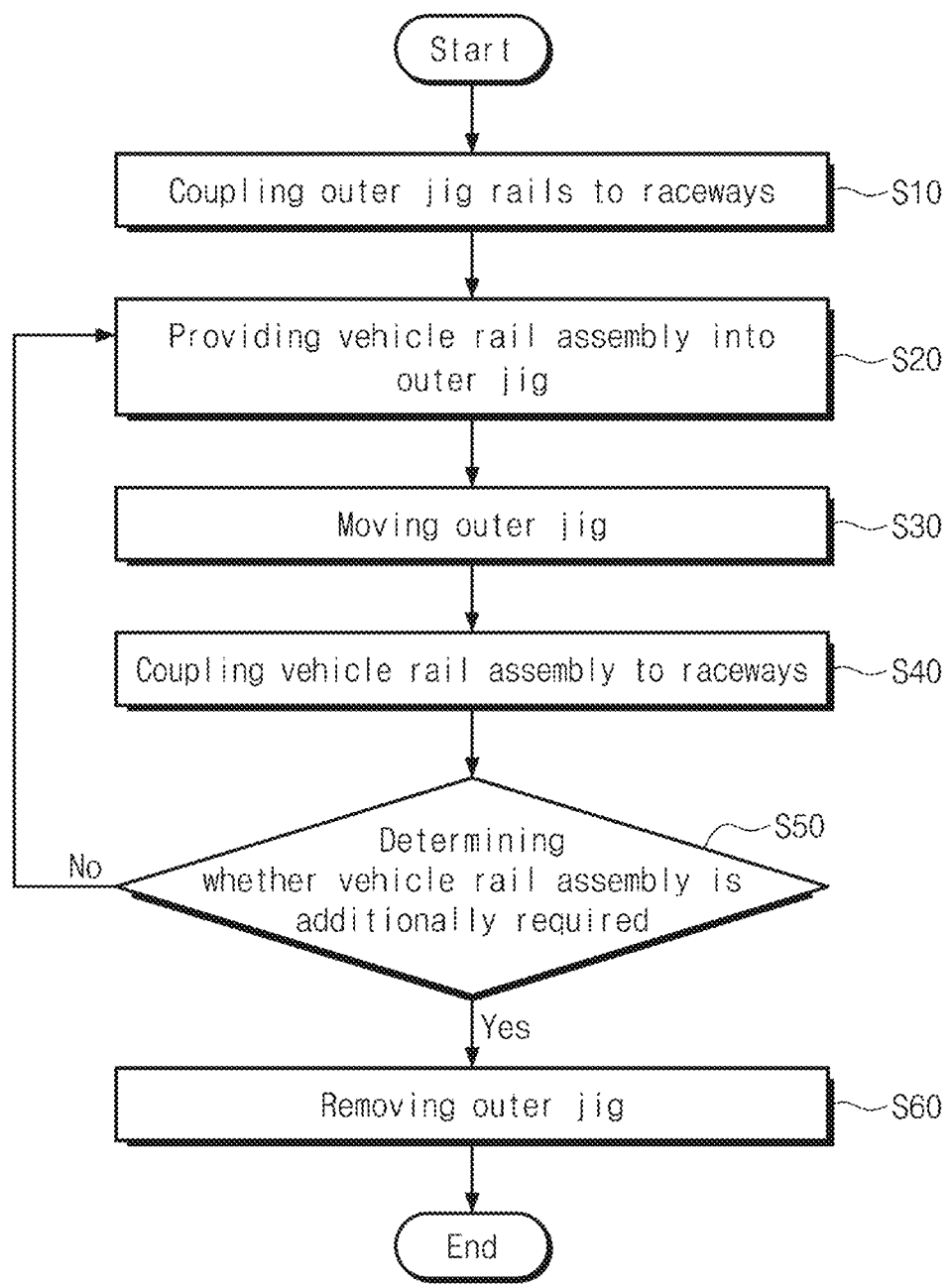
FIG. 7 illustrates a flow chart showing a method of establishing a vehicle rail assembly depicted in FIG. 1.
Figure 8:
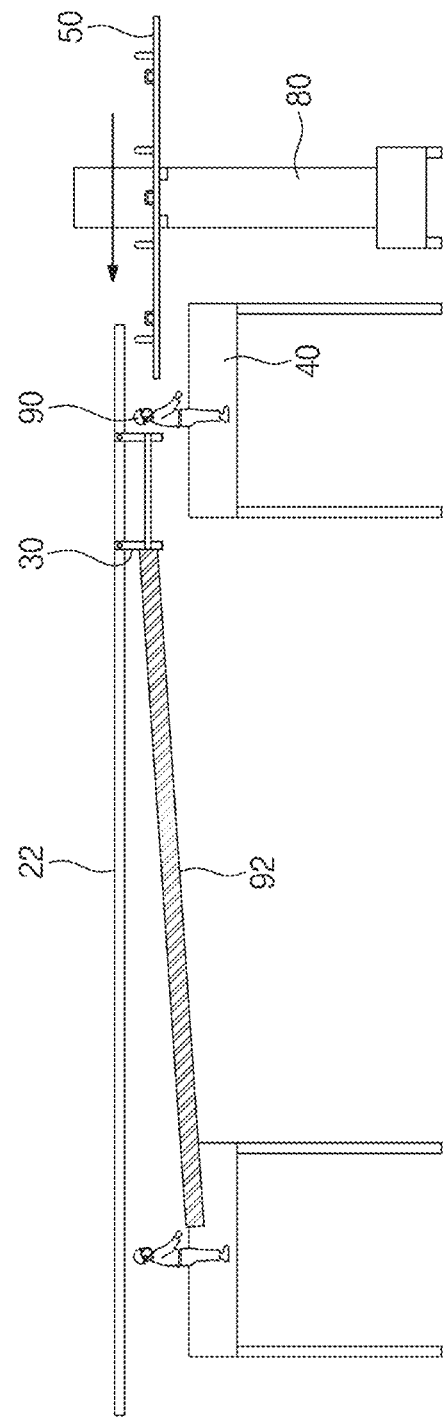
FIGS. 8 to 10 illustrate cross-sectional views showing a process of establishing a vehicle rail assembly.
Figure 9:
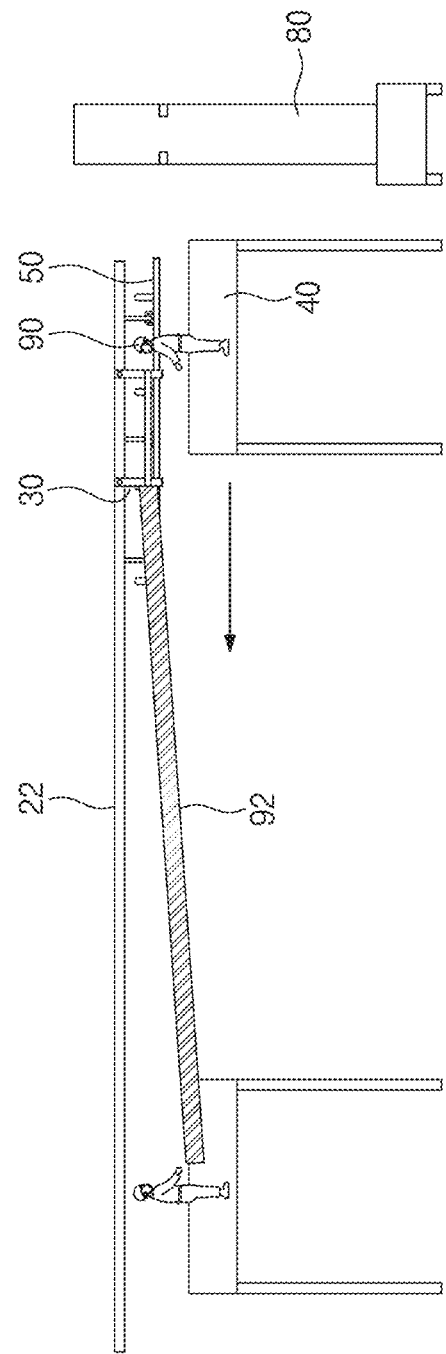
Figure 10:
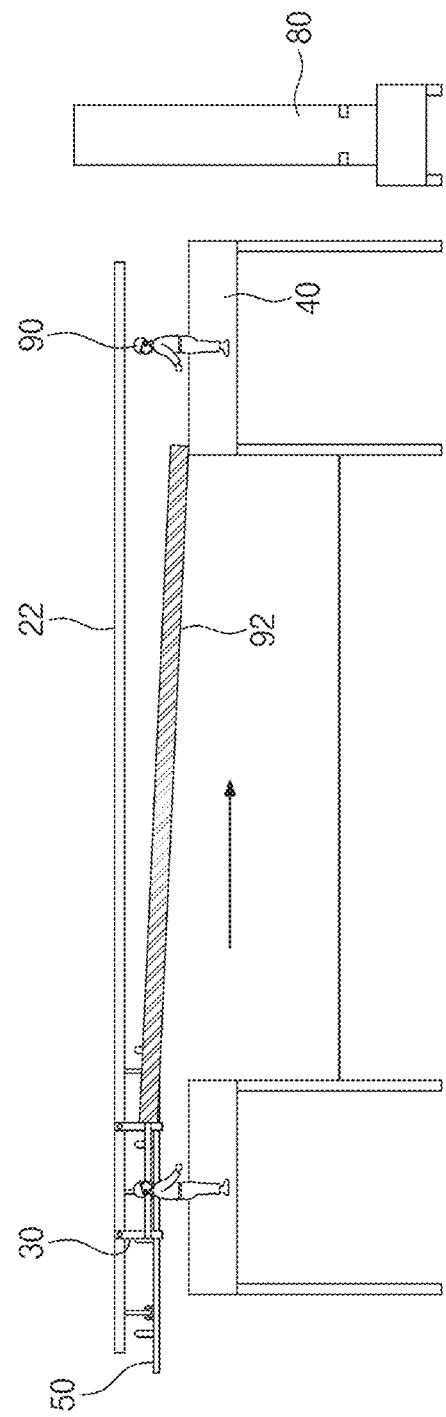

FIG. 7 shows a method of establishing the vehicle rail assembly 50 depicted in FIG. 1. FIGS. 8 to 10 illustrate cross-sectional views showing a process of establishing the vehicle rail assembly 50.

Referring to FIGS. 1, 2, 7, and 8, an engineer 90 or a robot may couple the outer jig rails 22 to opposite outer sidewalls of the raceways 10 (S10). The outer jig rails 22 may be fastened through bolts (not shown) to opposite outer sidewalls of the raceways 10. Afterwards, the outer jig 30 may be provided on the outer jig rails 22. The outer jig 30 may be connected to a wire rope 92. A stacker 80 may provide the vehicle rail assembly 50 toward the outer jig 30.

Referring to FIGS. 3, 7, and 9, the engineer 90 or the robot may provide the vehicle rail assembly 50 into the outer jig 30 (S20). The vehicle rail assembly 50 may be provided on the first and second outer jigs 32 and 34 of the outer jig 30.

Referring still to FIGS. 5, 7, and 9, the engineer 90 or the robot may pull the wire rope 92 from one side of the raceways 10 toward other side of the raceways 10, and thus the outer jig 30 may move (S30). When the outer jig 30 and the vehicle rail assembly 50 move to the another side of the raceways 10, the table lifting unit 40 may lift the vehicle rail assembly 50.

Referring to FIGS. 5 to 7 and 10, the engineer 90 or the robot may couple the vehicle rail assembly 50 to the raceways 10 (S40). The rail hangers 56 of the vehicle rail assembly 50 may be combined with the raceways 10. Thereafter, the engineer 90 or the robot may use the wire rope 92 to move the outer jig 30 from the another side of the raceways 10 toward the one side of the raceways 10. In addition, the table lifting unit 40 may be separated from the vehicle rail assembly 50.

The robot may determine whether the vehicle rail assembly 50 is additionally desired or not (S50).

When the vehicle rail assembly 50 is not additionally desired, the outer jig 30 may be removed from the outer jig rails 22 (S60). When the outer jig 30 is separated from the outer jig rails 22, the wiring duct 102 may be provided on the outer jig rails 22.

When the vehicle rail assembly 50 is additionally desired, the engineer 90 or the robot may provide the vehicle rail assembly 50 into the outer jig 30 (S20). The steps S20 to S50 may be repeatedly carried out.

Figure 11:
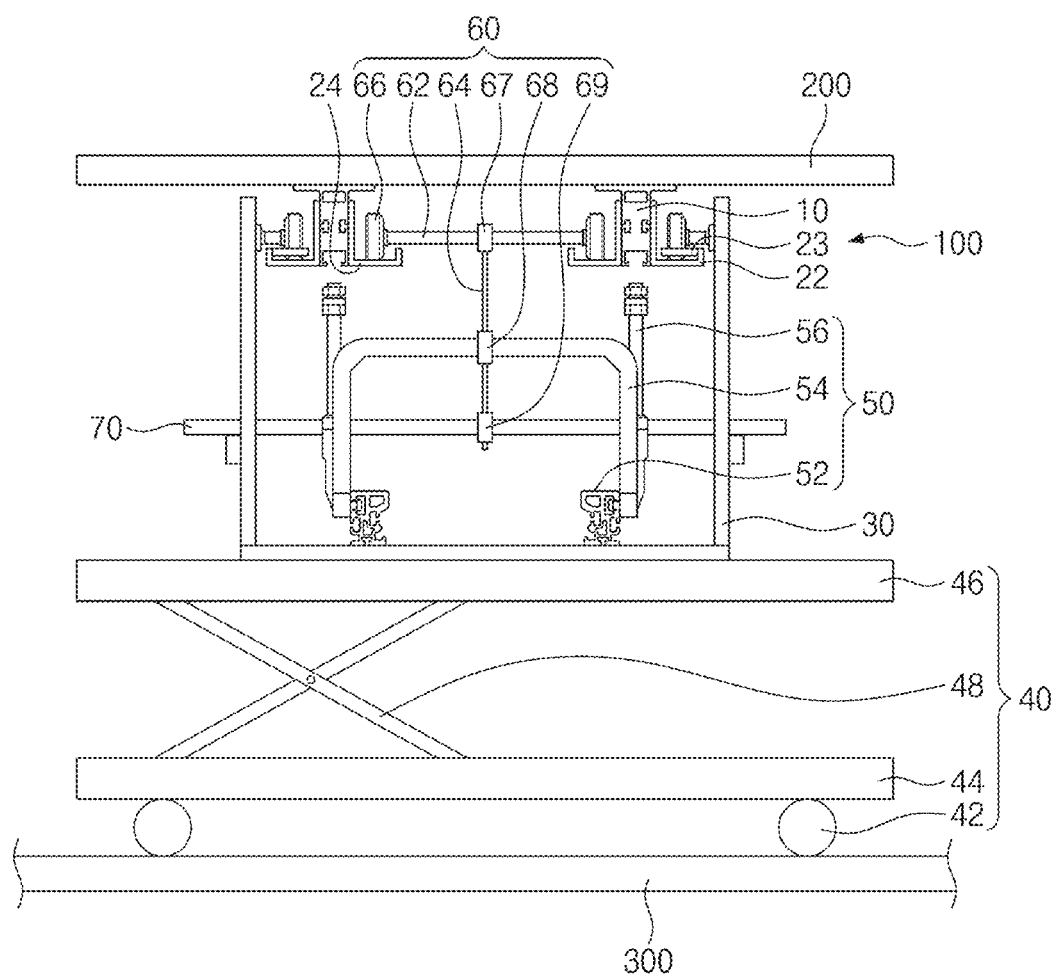
FIG. 11 illustrates a cross-sectional view showing an example of a semiconductor fabrication facility according to an example embodiment of the present inventive concepts.

FIG. 11 shows an example of the semiconductor fabrication facility 100 according to an example embodiment of the present inventive concepts.

Referring to FIG. 11, the semiconductor fabrication facility 100 according to an example embodiment of the present inventive concepts may further include inner jig rails 24, an inner jig 60, and a lever 70. The raceways 10, the outer jig rails 22, the outer jig 30, the table lifting unit 40, and the vehicle rail assembly 50 may be configured identical to those of FIG. 1.

The inner jig rails 24 may be placed between the outer jig rails 22. The inner jig rails 24 may be located on opposite facing inner walls of the raceways 10. The inner jig rails 24 may support the inner jig 60. Each of the inner jig rails 24 may have an L-type cross-section. For example, the inner jig rails 24 may include metal, such as iron or tungsten.

Figure 12:
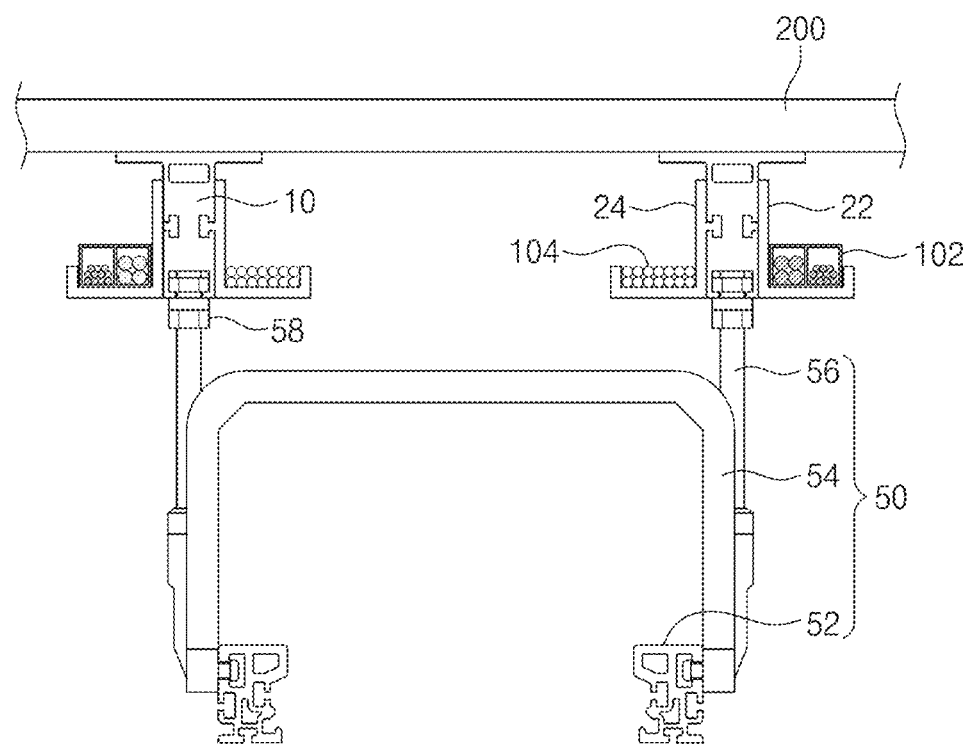
FIG. 12 illustrates a cross-sectional view showing an example of inner jig rails depicted in FIG. 11.

FIG. 12 shows an example of the inner jig rails 24 depicted in FIG. 11.

Referring to FIG. 12, when the vehicle rail assembly 50 is coupled to the raceways 10, and when the outer jig 30, the table lifting unit 40, the inner jig 60, and the lever 70 are removed, each of the outer and inner jig rails 22 and 24 may receive electric lines 104. The electric lines 104 may include a power line or communication line, but the present inventive concepts are not limited thereto.

Referring back to FIG. 11, the inner jig 60 may be provided in or within the outer jig 30. The inner jig 60 may be provided between or on the inner jig rails 24. The inner jig 60 may allow the rail connector 54 and the lever 70 to be supported by the inner jig rails 24. In other words, the inner jig 60 may allow the vehicle rail assembly to move along the inner jig rail 24. For example, the inner jig 60 may include metal, such as iron or tungsten. In some example embodiments, the inner jig 60 may include a polymer compound such as plastic, but the present inventive concepts are not limited thereto. According to an example embodiment, the inner jig 60 may include a horizontal bar 62, a vertical bar 64, second rails 66, an upper clamp 67, a middle clamp 68, and a lower clamp 69.

The horizontal bar 62 may be provided between the inner jig rails 24. The horizontal bar 62 may be connected between the second rails 66. The horizontal bar 62 may support the vertical bar 64.

The vertical bar 64 may be connected to a center of the horizontal bar 62. The vertical bar 64 may connect the rail connector 54 and the lever 70 to the horizontal bar 62. The vertical bar 64 may move in a vertical direction when the vehicle rail assembly 50 is coupled to the raceways 10, but the present inventive concepts are not limited thereto.

The second rails 66 may be connected opposite ends of the horizontal bar 62. The second rails 66 may be provided on the inner jig rails 24. The second rails 66 may cause the horizontal bar 62 and the vertical bar 64 to move in a horizontal direction along the raceways 10.

The upper clamp 67 may be provided on a top end of the vertical bar 64. The upper clamp 67 may be provided on the center of the horizontal bar 62. The upper clamp 67 may connect the vertical bar 64 to the horizontal bar 62. For example, the upper clamp 67 may have a ring shape like question mark "?". In such cases, when the lever 70 ascends, the upper clamp 67 may separate the vertical bar 64 from the horizontal bar 62, but the present inventive concepts are not limited thereto.

The middle clamp 68 may be provided on the vertical bar 64 between the upper clamp 67 and the lower clamp 69. When the second rails 66 rotates or when the lever 70 ascends, the middle clamp 68 may support the rail connector 54. The middle clamp 68 may have a V shape.

The lower clamp 69 may be provided on a bottom end of the vertical bar 64. The lower clamp 69 may support the lever 70. The lower clamp 69 may have a ring shape.

The lever 70 may be provided in the lower clamp 69. The lever 70 may be provided on the connection bars 36 of the outer jig 30. The lever 70 may allow the rail connector 54 to be supported by the connection bars 36. In addition, the lever 70 may be used when the vehicle rail assembly 50 is coupled to the raceways 10. The lever 70 may exactly align the vehicle rail assembly 50 with the raceways 10. For example, the vehicle rail assembly 50 may ascend when the engineer 90 lift opposite ends of the lever 70.

Accordingly, the semiconductor fabrication facility 100 according to some example embodiments of the present inventive concepts may increase productivity and efficiency of fastening between the raceways 10 and the vehicle rail assembly 50.

As discussed above, a semiconductor fabrication facility according to some example embodiments of the present inventive concepts may be configured such that an inner jig rail, an outer jig rail, an inner jig, an outer jig, and a table lifting unit are used to easily establish a vehicle rail assembly to raceways.

Although the present inventive concepts have been described in connection with some example embodiments illustrated in the accompanying drawings, it will be understood to those skilled in the art that various changes and modifications may be made without departing from the technical spirit and essential feature of the disclosed example embodiments. It therefore will be understood that the example embodiments described above are just illustrative but not limitative in all aspects.

What is claimed is:

1. A semiconductor fabrication facility, comprising:
raceways on a ceiling of a structural construction, the raceways extending in one direction;
a vehicle rail assembly coupled to the raceways;

outer jig rails on outer sidewalls of the raceways and adjacent to the vehicle rail assembly; and an outer jig on the outer jig rails, the outer jig including first rollers configured to rotate along the outer jig rails, stoppers on the outer jig rails, the stoppers configured to fix the first rollers.

2. The semiconductor fabrication facility of claim 1, wherein each of the outer jig rails has an L-type cross-section.

3. The semiconductor fabrication facility of claim 1, wherein the outer jig further includes:
a first outer support;
a second outer support separated from the first outer support, the first outer support and the second outer support having a same shape; and
connection bars connecting the second outer support to the first outer support.

4. The semiconductor fabrication facility of claim 3, wherein the first rollers are connected to ends of the first and second outer supports.

5. The semiconductor fabrication facility of claim 3, wherein each of the first and second outer supports has a U shape.

6. The semiconductor fabrication facility of claim 1, further comprising:
inner jig rails on facing inner sidewalls of the raceways.

7. The semiconductor fabrication facility of claim 6, further comprising:
an inner jig on the inner jig rails, the inner jig configured to allow the vehicle rail assembly to move along the inner jig rails.

8. The semiconductor fabrication facility of claim 7, wherein the vehicle rail assembly includes:
vehicle rails parallel to the raceways;
a rail connector connecting the vehicle rails to each other; and
hangers connecting the rail connector and the vehicle rails to the raceways.

9. The semiconductor fabrication facility of claim 8, wherein the inner jig includes:
second rails on the inner jig rails;
a horizontal bar connecting the second rails to each other; and
a vertical bar connecting the horizontal bar to the rail connector.

10. A semiconductor fabrication facility, comprising:
raceways on a ceiling of a structural construction, the raceways extending in one direction;
a vehicle rail assembly coupled to the raceways;
outer jig rails on outer sidewalls of the raceways and adjacent to the vehicle rail assembly;
an outer jig on the outer jig rails, the outer jig including first rollers configured to rotate along the outer jig rails;
inner jig rails on inner sidewalls of the raceways;
an inner jig on the inner jig rails, the inner jig configured to allow the vehicle rail assembly to move along the inner jig rails; and
stoppers on the outer jig rails, the stoppers configured to fix the first rollers.

11. The semiconductor fabrication facility of claim 10, wherein the outer jig further includes:
a first outer support;
a second outer support separated from the first outer support, the first outer support and the second outer support having a same shape; and
connection bars connecting the second outer support to the first outer support.

12. The semiconductor fabrication facility of claim 11, wherein the inner jig includes:
second rails on the inner jig rails;
a horizontal bar connecting the second rails to each other; and
a vertical bar connecting the horizontal bar to the vehicle rail assembly.

13. The semiconductor fabrication facility of claim 12, further comprising:
a lever connected to the vertical bar and supported by the connection bars.

14. The semiconductor fabrication facility of claim 13, wherein the inner jig includes:
a middle clamp configured to clamp the vehicle rail assembly to the vertical bar; and
a lower clamp below the middle clamp, the lower clamp configured to clamp the lever to the vertical bar.

15. A semiconductor fabrication facility, comprising:
raceways on a ceiling of a structural construction, the raceways extending in one direction;
a vehicle rail assembly coupled to the raceways;
outer jig rails on outer sidewalls of the raceways and adjacent to the vehicle rail assembly;
an outer jig on the outer jig rails, the outer jig configured to allow the vehicle rail assembly to move along the outer jig rails;
inner jig rails on inner sidewalls of the raceways;
an inner jig on the inner jig rails, the inner jig configured to allow the vehicle rail assembly to move along the inner jig rails;
a table lifting unit configured to support the vehicle rail assembly; and
a lever on the table lifting unit, the lever configured to lift the inner jig and the vehicle rail assembly.

16. The semiconductor fabrication facility of claim 15, wherein each of the outer jig rails and the inner jig rails has an L-type cross-section.

17. The semiconductor fabrication facility of claim 15, wherein the outer jig includes:
a first outer support;
a second outer support separated from the first outer support, the first outer support and the second outer support having a same shape; and
connection bars connecting the second outer support to the first outer support.

18. The semiconductor fabrication facility of claim 17, wherein the inner jig includes:
second rails on the inner jig rails;
a horizontal bar connecting the second rails to each other;
a vertical bar on a center of the horizontal bar;
an upper clamp on a top end of the vertical bar, the upper clamp configured to connect the vertical bar to the horizontal bar;
a middle clamp on the vertical bar and below the upper clamp, the middle clamp configured to support the vehicle rail assembly; and
a lower clamp on a bottom end of the vertical bar, the lower clamp configured to receive the lever.

19. The semiconductor fabrication facility of claim 17, wherein the lever is on the connection bars.

* * * * *

UNITED STATES PATENT AND TRADEMARK OFFICE
CERTIFICATE OF CORRECTION

| | | |
|---|---|---|
| PATENT NO. | : 12,394,650 B2 | Page 1 of 1 |
| APPLICATION NO. | : 17/894371 | |
| DATED | : August 19, 2025 | |
| INVENTOR(S) | : Youngon Oh et al. | |

It is certified that error appears in the above-identified patent and that said Letters Patent is hereby corrected as shown below:

On the Title Page

Item (30) Foreign Application Priority Data should read:
Jan. 20, 2022 (KR) 10-2022-0008813

Signed and Sealed this
Ninth Day of December, 2025

John A. Squires
*Director of the United States Patent and Trademark Office*